(12) United States Patent
Ota et al.

(10) Patent No.: US 6,866,949 B2
(45) Date of Patent: Mar. 15, 2005

(54) SUBSTRATE FILM, GAS BARRIER FILM, AND DISPLAY USING THE SAME

(75) Inventors: Yurie Ota, Tokyo (JP); Toshio Yoshihara, Tokyo (JP); Keiji Tokunaga, Tokyo (JP); Minoru Komada, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 0 days.

(21) Appl. No.: 10/382,368

(22) Filed: Mar. 6, 2003

(65) Prior Publication Data

US 2004/0018364 A1 Jan. 29, 2004

(30) Foreign Application Priority Data

| Mar. 8, 2002 | (JP) | ........................................ 2002-063234 |
| Mar. 8, 2002 | (JP) | ........................................ 2002-063259 |
| Aug. 6, 2002 | (JP) | ........................................ 2002-228614 |

(51) Int. Cl.[7] .............................................. B32B 15/08
(52) U.S. Cl. ........................ 428/702; 428/1.1; 428/1.6; 428/337; 428/339; 428/412; 428/447
(58) Field of Search .......................... 428/1.1, 1.6, 337, 428/339, 412, 447, 457, 702

(56) References Cited

U.S. PATENT DOCUMENTS

| 5,422,185 | A | * | 6/1995 | Egami et al. ................ 428/412 |
| 5,770,301 | A | * | 6/1998 | Murai et al. ................. 428/213 |
| 6,369,871 | B1 | * | 4/2002 | Hanada et al. ............... 349/158 |
| 6,680,242 | B2 | * | 1/2004 | Ohtsu et al. ................. 438/487 |
| 2002/0098296 | A1 | * | 7/2002 | Inagaki et al. ............... 427/489 |
| 2002/0132454 | A1 | * | 9/2002 | Ohtsu et al. ................. 438/486 |
| 2003/0044517 | A1 | * | 3/2003 | Nishikawa et al. ........... 427/66 |
| 2003/0092267 | A1 | * | 5/2003 | Kian et al. ................... 438/690 |

* cited by examiner

*Primary Examiner*—Jeffrey B. Robertson
(74) *Attorney, Agent, or Firm*—Timothy J. Keefer

(57) ABSTRACT

The present invention provides a gas barrier film comprising a composite film provided with a gas barrier layer having a laminated structure including at least a metal oxide thin layer on a substrate film having a (1) 80 ppm/° C. or less coefficient of thermal expansion at 50° C. to 150° C. and/or a 10 ppm/% RH or less coefficient of humidity expansion at 25° C., and a (2) 150 C. ° or more glass transition temperature, and a display with a display element covered with the same.

11 Claims, 3 Drawing Sheets

SUBSTRATE FILM, GAS BARRIER FILM, AND DISPLAY USING THE SAME

BACKGROUND OF THE INVENTION

1. Field of the Invention

The present invention relates to a composite film having a gas barrier property. In particular, it relates to a gas barrier film suitable for use in the packaging field requiring a high gas barrier property or use as a substrate for various kinds of displays, or use for covering a substrate.

Moreover, the present invention relates to a gas barrier film for a display substrate or suitable for the display covering application, to hardly generate expansion or distortion derived from heat or moisture at the time of processing or use, and a substrate film therefor.

Furthermore, the present invention relates to a display using such a gas barrier film.

2. Description of the Related Art

Nowadays, various types of displays are used or discussed for their practical uses. Except the cathode ray tube type, all of them aim at a thinner configuration. Furthermore, those of the flexible type are being requested. Then, use of a synthetic resin sheet or a synthetic resin film is being discussed instead of the glass substrate conventionally comprising the display. Furthermore, in order to prolong the life of the display, covering the display with a gas barrier film for blocking a color developing element or a light emitting element from the external oxygen or water vapor has been discussed. The terms "sheet" and "synthetic resin film" refer to those having a relatively thin thickness of about 100 $\mu$m or less, however, in the present invention, the film and the synthetic resin film refer to both those having a thick thickness and those having a thin thickness.

Conventionally, in the field of packaging such as food packaging, various kinds of gas barrier films with the gas and the moisture content permeating property restrained (that is, the gas barrier property provided) by forming a thin layer of a metal oxide such as a silica and an alumina on a plastic film for improving the food long term storage property have been used. As an example, an alumina deposition film or a silica deposition film having a PET (polyethylene terephthalate resin) film used as the substrate film has been used.

However, it has been found that the gas barrier property is not sufficient when the gas barrier films conventionally used in the packaging field is used as a display substrate or for covering or sealing a display because the display itself is installed over a long term so that the exposure condition is severer than that of the food, such as influence of the potential or temperature rise at the time of use. Furthermore, the substance related to the display light emission and the light modulation is not chemically highly stable.

As another problem, to the synthetic resin film as the display substrate material or the synthetic resin film as the substrate for a gas barrier film for covering the display, in addition to the mechanical strength, the smoothness, the gas barrier property, or the like, the heat resistance or the moisture resistance are required in the stage of executing a process of laminating various layers on the synthetic resin film for providing a display, a process of providing a gas barrier layer, or the like. However, according to a common synthetic resin film, since the heat resistance or the moisture resistance is drastically poorer than the glass substrate, deformation or size change caused by heating in the metal thin layer forming process by deposition, or the like, heating in the heating step after coating a thermosetting resin coating material, or the like, or deformation or size change caused by moisture absorption due to contact with an aqueous solution in the metal thin layer etching process or the resist developing process cannot be avoided so that the problems such as deterioration of flatness of the obtained display or the gas barrier film, peel off due to creep with respect to the laminated metal thin layer and deviation with respect to a preset size can be generated.

SUMMARY OF THE INVENTION

Accordingly, an object of the present invention is to provide a gas barrier film having a gas barrier property higher than that of the conventional products with a thin layer of a silica, an alumina or the like formed on a plastic film.

Moreover, another object of the present invention is to provide a display or a gas barrier film capable of in particular avoiding the above-mentioned problems generated by deformation or size change caused by heat or moisture absorption in the above-mentioned various processes.

Furthermore, still another object of the present invention is to provide a display using such a gas barrier film.

According to study of the present inventor, it is found that the problems caused by deformation or size change of the substrate film at the time of heating or moisture absorption can be avoided by using a thermally resistant synthetic resin film having a 80 ppm/C.° or less coefficient of thermal expansion or a 10 ppm/% RH or less coefficient of humidity expansion, and a 150 C.° or more glass transition temperature as the substrate film.

Furthermore, the present inventors have studied, focusing at the fact that the thin layer of a metal oxide such as an alumina, a silica or the like which is used in the conventional gas barrier film generates its defects due to the unevenness produced at the time when it is formed by crystal growth to cause deterioration of the air permeability or the water vapor permeability. As a result, the conventional metal oxide thin layer is basically used as the gas barrier property providing means for the plastic film, and further an overcoat layer made of a material having the excellent affinity with the thin layer is formed for compensating the deterioration of the gas barrier property due to the defect of the thin layer so as to laminate the gas barrier layer combining the overcoat layer with the thin layer on the plastic film. Thus a high gas barrier performance can be obtained.

Based on the above-mentioned knowledge, a first aspect of the present invention is a gas barrier film comprising a composite film provided with a gas barrier layer having a laminated structure including at least a metal oxide thin layer on a substrate film having a (1) 80 ppm/° C. or less coefficient of thermal expansion at 50° C. to 150° C. and/or a 10 ppm/% RH or less coefficient of humidity expansion at 25° C., and a (2) 150 C.° or more glass transition temperature.

According to the substrate film of the gas barrier film of the present invention, since the upper limit value of either of the coefficient of thermal expansion and the coefficient of humidity expansion of the substrate film, or the upper limit values of both of the coefficient of thermal expansion and the coefficient of humidity expansion are limited, expansion by the heat is extremely small when the upper limit value of the coefficient of thermal expansion is limited, and expansion by moisture absorption is extremely small when the upper limit value of the coefficient of humidity expansion is limited, and thus problems of deterioration of flatness, peel off of the laminated thin layer, or deviation with respect to a preset size due to heat or moisture absorption at the time of process can be prevented. Furthermore, since the lower limit value of the glass transition temperature is limited, softening and deformation by the external stress can be prevented.

Since the composite film having a metal oxide thin layer laminated on the substrate film has no risk of deterioration of flatness, peel off of the laminated thin layer, or deviation with respect to a preset size due to heat or moisture absorption at the time of production, it is preferable as a gas barrier film.

According to the gas barrier film of the present invention, it is preferable that the above-mentioned gas barrier layer has a laminated structure with at least the above-mentioned thin layer and an overcoat layer made of a gas barrier property resin for filling the minute pores of the thin layer laminated in this order from the substrate film side. In this case, the gas barrier property can further be improved.

The above-mentioned thin layer of the gas barrier layer is formed representatively either by a physical or chemical vapor phase method selected from the group consisting of a vapor deposition method, a sputtering method, an ion plating method and a plasma chemical vapor phase epitaxy method, or a liquid phase deposition method selected from the group consisting of a plating and a sol-gel method.

According to these film formation methods, an gas barrier film with the thin layer being thin and even can be provided.

It is preferable that the above-mentioned overcoat layer of the gas barrier layer is made of a polysiloxane, and in particular, it is a coating layer of a coating material composition composed of at least a silane coupling agent having an organic functional group and a hydrolysis group, and a cross-linkable compound having an organic functional group reactive with the organic functional group of the above-mentioned silane coupling agent as a raw materials.

The excellent gas barrier property can be obtained by forming the overcoat layer from the above-mentioned materials, thereby providing a gas barrier film having a high gas barrier property, which has never been obtained conventionally.

It is further preferable that the rigidity of the above-mentioned substrate film is in a range of 0.5 N to 15 N. By having the rigidity of the substrate film in this range, since the crack generation in the thin layer derived from bending of the substrate film can be prevented, the gas barrier property can further be improved.

Furthermore, the gas barrier film of the present invention may have the above-mentioned gas barrier layer including at least the thin layer by two or more sets on the substrate film, or the above-mentioned composite film including the gas barrier layer and the substrate film by two or more sheets. Since overlying of the gas barrier layers or the substrate films by two or more can accumulate the gas barrier function, a gas barrier film having a high gas barrier property can be provided.

A second aspect of the present invention relates to the substrate film itself used for the above-mentioned gas barrier film of the present invention, and it is use of a substrate film having a (1) 80 ppm/° C. or less coefficient of thermal expansion at 50° C. to 150° C. and/or a 10 ppm/% RH or less coefficient of humidity expansion at 25° C., and a (2) 150° C. or more glass transition temperature in the gas barrier film application.

Since the substrate film for the gas barrier film of the present invention hardly generates expansion by heat and/or moisture absorption at the time of processing or using the product to which the gas barrier film is applied, and does not generate deformation at a high temperature, it can hardly cause deformation or peel off of the gas barrier layer. Therefore, it is suitable as a substrate film for the gas barrier film, in particular, that used for the gas barrier film for a display element, which is required to have a high gas barrier performance.

A third aspect of the present invention is a display with at least one surface of a display element covered with the above-mentioned gas barrier film of the present invention. By using the above-mentioned gas barrier film of the present invention, a display with the gas barrier property improved can be provided.

According to the display of the present invention, the above-mentioned gas barrier film may be laminated on the both side surfaces of the display element, or the display element may be sealed by the above-mentioned gas barrier film.

Moreover, the above-mentioned gas barrier film may form a substrate of at least the observer side of the display element. Since the gas barrier film forms at least the observer side substrate, complication of the configuration can be avoided, and furthermore, a display capable of maintaining a high gas barrier property can be provided without substantial increase of the thickness.

As a display element covered preferably by the above-mentioned gas barrier film, a liquid crystal display panel and an organic EL element can be presented. By covering the liquid crystal display panel with the gas barrier film of the present invention, the characteristics of the liquid crystal display can be maintained stably over a long term. Moreover, by covering the organic EL element with the gas barrier film of the present invention, the characteristics of the organic EL element can be maintained stably over a long term so that generation and growth of dark spots can be restrained.

DESCRIPTION OF THE PREFERRED EMBODIMENTS

Figure 1:
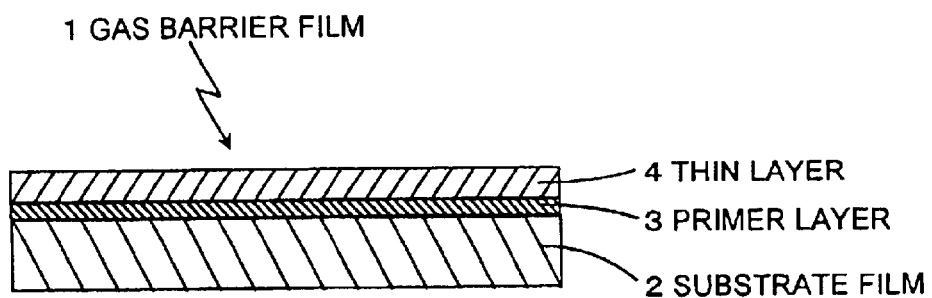
FIG. 1 is a schematic cross-sectional view showing an embodiment of the lamination structure of a gas barrier film of the present invention.
Figure 3:
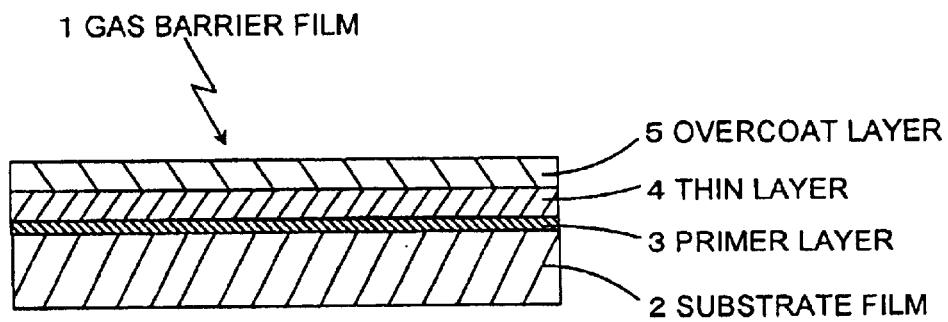
FIG. 3 is a schematic cross-sectional view showing still another embodiment of the lamination structure of a gas barrier film of the present invention.

A gas barrier film 1 according to the present invention (super high gas barrier film 1) basically comprises a metal oxide thin layer 4 laminated on a substrate film 2 as shown in FIG. 1, or it has a laminated structure comprising a metal oxide thin layer 4 and an overcoat layer 5 laminated on a substrate film 2 in this order from the substrate film side as shown in FIG. 3. The metal oxide thin layer 4 in FIG. 1 or the metal oxide thin layer 4 and the overcoat layer 5 in FIG. 3 provide the function as a gas barrier layer. The gas barrier layer may include a layer other than the thin layer 4 or the overcoat layer 5 as needed. In the two kinds of the embodiments, a primer layer 3 may be laminated between the substrate film 2 and the thin layer 4 as needed.

The gas barrier film 1 of the present invention may be a single layer plastic film or it may have a laminated film having two layer plastic films 2a, 2b, or layers more than that laminated as the substrate 2, and a gas barrier property thin layer 4 laminated on one side of the substrate 2 as needed via a primer layer. Furthermore, it may have a laminated film having three or more layers of plastic films laminated as the substrate 2.

As it will be described later, the gas barrier film 1 may include modified embodiments utilizing the above-explained basic structure.

The substrate film 2 is preferably one having the heat resistance because temperature rise is inevitable by heating at the time of forming the thin layer and/or forming the overcoat layer, and according to the application of use, heating can be accompanied. Moreover, when the gas barrier film 1 is used for a display substrate, or for covering or sealing a display, or the like, temperature rise can be possible at the time of using the display. Although it depends on the display type, when it is applied to an observer side of the display, it is preferable that it has the transparency for ensuring the video visibility.

In the present invention, for making effort to completely avoid deformation or size change of the substrate film which will be caused by heating or moisture absorption, it is preferable to use a substrate film having a low coefficient of thermal expansion or coefficient of humidity expansion, and either one having a 80 ppm/C.° or less coefficient of thermal expansion or one having a 10 ppm/% RH or less coefficient of humidity expansion is preferable. Moreover, it is further preferable that the substrate film 2 has both a low coefficient of thermal expansion and a low coefficient of humidity expansion. In this regard, it is further preferable that the substrate film 2 has a 80 ppm/° C. or less coefficient of thermal expansion and a 10 ppm/% RH or less coefficient of humidity expansion.

The coefficient of thermal expansion was obtained by using a thermo-mechanical analysis apparatus and a synthetic resin film as a specimen heated and dried at 80° C. for 10 minutes, and reading the size change in a temperature range of 50° C. to 150° C.

Moreover, the coefficient of humidity expansion was obtained by using a thermo-mechanical analysis apparatus and a synthetic resin film as a specimen heated and dried at 80° C. for 10 minutes, and reading the size change value at 25° C. temperature and 85% RH humidity after a 12 hour measurement time.

As to the substrate film 2, in addition to the above-mentioned limitation of either the coefficient of thermal expansion or the coefficient of humidity expansion, or the limitation of both the coefficient of thermal expansion and the coefficient of humidity expansion, it is preferable that the glass transition temperature (Tg) of the resin forming the substrate film 2 is 150° C. or more. When Tg is less than 150° C., the substrate film 2 can easily be softened due to heat provided at the time of forming the thin layer 4 on the substrate film 2 so that the substrate film 2 can easily be deformed by the external stress applied to the substrate film 2. In this regard, Tg is preferably high, but in the range to be shown specifically hereafter, it is 300° C. or less. When the glass transition temperature is more than 300° C., since the flexibility of the substrate itself becomes low so as to lose the flexibility, continuous process is difficult.

According to the gas barrier film of the present invention, when either the coefficient of thermal expansion or the coefficient of humidity expansion, or both of them are a value smaller than the limited upper value, even if the substrate film is heated or it absorbs moisture, distortion between the substrate film 2 and the thin layer 4 can hardly be generated so that a structure of the thin layer 4 can hardly be destroyed. Moreover, when Tg is higher than the limited lower value, it is hardly softened at the time of heating, and thus the substrate film 2 can hardly be deformed even if an external stress is applied so that breakage of the thin layer 4 structure due to distortion generation between the substrate film 2 and the thin layer 4 can be avoided. Therefore, according to the above-mentioned limitation, the glass barrier property can be maintained.

In consideration to the coefficient of thermal expansion, the coefficient of humidity expansion and the glass transition temperature, as the material synthetic resin forming the substrate film 2, among crystalline resins, thermoplastic resins such as a polyamide, a polyacetal, a polybutylene terephthalate, a polyethylene terephthalate, a polyethylene naphthalate (PEN), and a syndiotactic polystyrene, and thermosetting resins such as a polyphenyl sulfide, a polyether ether ketone, a liquid crystal polymer, a fluorine resin, and a polyether nitrile can be presented as the preferable resins.

Moreover, as the material synthetic resin forming the substrate film 2, among non-crystalline resins, thermoplastic resins such as a polycarbonate, a modified polyphenylene ether, a polycyclohexene, and a polynorbornen based resin, thermosetting resins such as a polysulfone, a polyether sulfone, a polyallylate, a polyamide imide, a polyether imide, and a thermoplastic polyimide can be presented as the more preferable resins. In particular, since a polycarbonate has a low water absorbing property, a substrate film 2 prepared using the same has a low coefficient of humidity expansion, and thus it is particularly preferable.

The thermal property required to the substrate film 2, in particular, the behavior with respect to the external stress can be defined also by a practical index of the load deflection temperature, and those having a 150° C. or more load deflection temperature are preferable. For the reference, the load deflection temperature of the resins are: 160° C. of a polycarbonate resin, 175° C. of a polyallylate resin, 210° C. of a polyether sulfone resin, 150° C. of a cycloolefin polymer (produced by ZEON CORPORATION, product name: "ZEONOR"), 155° C. of a norbornene based resin (produced by JSR Corporation, product name: "ARTON"), or the like.

Alternatively, the thermal property required to the substrate film 2 can also be defined by the highest continuous use temperature. Here, the highest continuous use temperature refers to the temperature immediately before generating the deflection of the film at the time when a certain temperature is applied for one hour. When it is used for producing a display, the highest continuous use temperature of the substrate film is preferably 150° C. or more. The highest continuous use temperature of the each resin in the range shown in the above-mentioned resins is equivalent to the load deflection temperature of the same resin.

In order to further improve the gas barrier property, it is preferable to use a plastic film having the rigidity of the substrate film 2 in a range of 0.5 N to 15 N, and it is more preferably 1.0 to 10 N.

When the rigidity of the substrate film is in the above-mentioned range, since minute cracks in the gas barrier layer which will be derived from a bending action of the plastic film can rarely be generated at the time of forming a metal oxide thin layer to be described later, a gas barrier film 1 having an inherently high gas barrier property can be produced. Moreover, also at the time of handling immediately after formation of the metal oxide thin layer or at the time of running along the roller of a processing machine, the generation of the minute cracks in the gas barrier layer can be prevented. Of course, at the time of handling the product as the gas barrier film, minute crack generation in the gas barrier layer can be prevented, and thus the gas barrier layer can be maintained preferably without deterioration of the characteristics of the metal oxide thin layer.

When the rigidity of the substrate film is less than 0.5 N, the mechanical suitability tends to be poor at the time of forming the thin layer 4 as the gas barrier layer, or at the time of handing before and after formation of the thin layer 4. Moreover, the gas barrier property of the formed thin layer 4 with respect to the water vapor, the oxygen gas, or the like tends to be lowered. In contrast, when the rigidity is more than 15 N, since the shock resistance is poor as in the case of a glass at the time of handling after formation of the thin layer 4 as the gas barrier layer, it can hardly be wound up. Moreover, a the time of winding up, the gas barrier property with respect to the water vapor, the oxygen gas, or the like can be lowered.

Figure 7A:
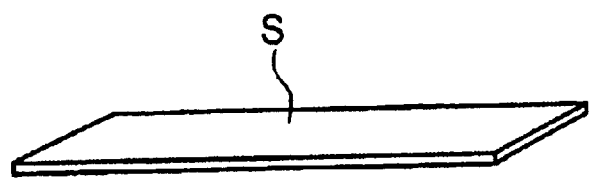
Figure 7B:
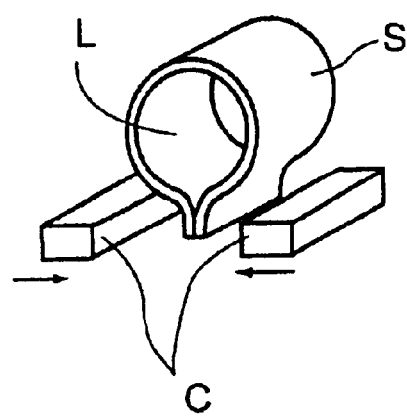
Figure 7C:
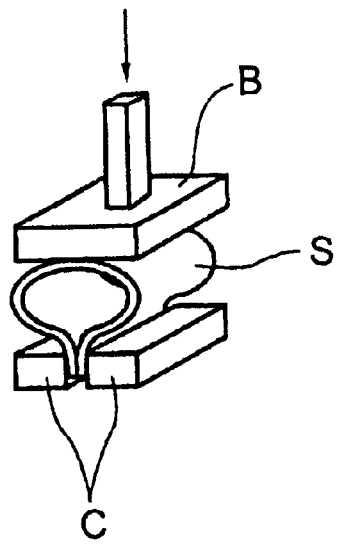

In the present invention, the rigidity of the substrate film was measured as follows. First, as shown in FIG. 7A, a piece S of a strip specimen having a 25 mm width and a 12 cm length was cut out from the plastic film. Then, as shown in FIG. 7B, with the shorter sides of the both ends of the specimen piece superimposed, the superimposed part was placed in the chuck C of a universal tester (produced by Orientech Co., Ltd., product number: "RTC-1310A") by 1 cm so as to form a loop L by the remaining 10 cm part. Thereafter, in this state, as shown in FIG. 7C, the plat B was lowered onto the loop L with the condition of a 200 mm/min pressing speed and a 20 mm pressing distance so as to press the loop L, and the measurement value obtained by measuring the repulsion force of the loop L was defined to be the rigidity (N).

In consideration of the rigidity, as the synthetic resin of the material forming the film 2, a cyclic polyolefin based resin, a polystyrene based resin, an acrylonitrile-styrene copolymer (AS resin), an acrylonitrile-butadiene-styrene copolymer (ABS resin), a poly(meth)acrylic based resin, a polycarbonate based resin, a polyester based resin such as a polyethylene terephthalate (PET) and a polyethylene naphthalate (PEN), a polyamide based resin such as various kinds of nylons, a polyurethane based resin, a fluorine based resin, an acetal based resin, a cellulose based resin, a polyether sulfone based resin, and other various kinds of resin films can be used. In the present invention, as the plastic film of the substrate 2, among the above-mentioned examples, it is particularly preferable to use a film of a polyester based resin, a polycarbonate based resin, or a polyether sulfone based resin. Moreover, as a film having the excellent heat resistance, mechanical characteristic or the like, in addition to the above-mentioned, crystalline resins including thermoplastic resins such as a polybutylene terephthatlate and a syndiotactic polystyrene, and thermosetting resins such as a polyphenylene sulfide, a polyether ether ketone, a liquid crystal polymer and a polyether nitrile, and non-crystalline resins including thermoplastic resins such as a modified polyphenylene ether and a thermoplastic polyimide, and thermosetting resins such as a polysulfone, a polyallylate, a polyamide imide, and a polyether imide, or the like can be used as well.

Furthermore, in consideration of the film rigidity as well as the coefficient of thermal expansion, the coefficient of humidity expansion and the glass transition temperature, as the preferable substrate film, a polyethylene naphthalate (PEN), a polycarbonate, a polyether sulfone, a polyether ether ketone, a polyallylate, a polyimide, a polynorbornene, a polycyclohexene, a poly(meth)acrylic based resin or the like can be presented.

Moreover, the thickness of the substrate film 2 is about 1 to 400 $\mu$m, and it can be selected optionally according to the application.

In order to improve the surface smoothness of the end product and form the thin layer 4 evenly, the substrate film 2 is preferably one having a high surface smoothness. A high smoothness is preferable also for preventing disconnection when an electrode such as an ITO is formed on the thin layer 4. From these viewpoints, as to the surface smoothness, those having a 2 nm or less average roughness (Ra) are preferable. The lower limit is not particularly set, however, in the practical use, it is 0.01 nm or more. As needed, it is possible to improve the smoothness by polishing the both sides of the substrate film, or at least the side provided with the thin layer 4.

To the both sides of the substrate film 2, or at least to the side provided with the thin layer 4, in order to improve the bonding property, various kinds of known processes, such as a corona discharge process, a flame process, an oxidation process, a plasma process, lamination of a primer layer, or the like can be applied as needed in a combination.

Among the processes for improving the bonding property, the primer layer 3 lamination is effective not only for improving the product durability by improving the bonding force of the thin layer 4 but also for evenly forming the thin layer 4 by improving the surface smoothness of the side provided with the thin layer 4 of the substrate film 2. As the primer layer 3, specifically, a layer of about a 0.1 to 5 $\mu$m thickness containing a resin such as a polyethylene imine, a polyurethane, a polyester and an acrylic can be formed. In general, it can be formed by coating the same as a solvent solution and drying. The primer layer 3 can be formed with a material forming the overcoat layer 5.

The thin layer 4 is not particularly limited, and those conventionally used for the layer for providing the gas barrier property can be used.

It is preferable to form the thin layer 4 with various kinds of metal oxide represented by an $SiO_x$ mainly containing an $SiO_2$ and an $Al_2O_3$ in terms of the transparency. Including these examples, the thin layer 4 can be formed with an oxides such as an aluminum oxide, a zinc oxide, an antimony oxide, an indium oxide, a cerium oxide, a calcium oxide, a cadmium oxide, a silver oxide, a gold oxide, a chromium oxide, a silicon oxide, a cobalt oxide, a zirconium oxide, a tin oxide, a titanium oxide, an iron oxide, a copper oxide, a nickel oxide, a platinum oxide, a palladium oxide, a bismuth oxide, a magnesium oxide, a manganese oxide, a molybdenum oxide, a vanadium oxide and a barium oxide.

When the transparency is not required or the gas barrier layer is formed in two or more layers, a thin layer can be formed with an aluminum, a silicon, a metal comprising the above-mentioned oxides, an SiN, or the like.

As to the thin layer 4 forming method, a physical vapor phase method (PVD) such as a vacuum vapor deposition method, a sputtering method, and an ion plating method, a chemical vapor phase method (CVD) such as a plasma chemical vapor phase epitaxy method, a liquid phase deposition method such as a plating, a sol-gel method, a wet coating, or the like can be presented. Among these examples, the chemical vapor phase method (CVD) is preferable in that an even thin layer is easily obtained with a high production speed and in that it relatively can avoid the thermal influence to the substrate film 2 at the time of formation and the thermal deterioration of the plastic film accompanied thereby. However, excluding the thermal influence to the substrate film 2, the thin layer 4 can be formed by the physical vapor phase method.

Moreover, among the chemical vapor phase methods, by using the plasma CVD method which forms a thin layer by introducing a material gas and applying a high frequency for generating electric discharge for providing a plasma state so as to promote the chemical reaction on the surface of the substrate film 2, the thin layer formation can be executed at a low temperature (low temperature of about −10° C. to 200° C., and possibly 30° C. or lower) to the extent that the thermal damage is not applied to the plastic film constituting the substrate film 2, and furthermore an advantage capable of controlling the composition, the infrared ray absorption, the light refractive index or the like of the thin layer to be formed by controlling the kind and the flow amount of the material gas, the pressure, electric power for generating the plasma state or the like as it will be explained in the following embodiment of a silicon oxide thin layer, and thus it is particularly preferable.

Furthermore, among the above-mentioned materials, a thin layer made of a silicon oxide is preferable, and among the thin layers made of a silicon oxide, those formed by a chemical vapor phase method (CVD) is preferable for the reasons described in the above-mentioned paragraph.

At the time of forming the thin layer 4 as a silicon oxide thin layer, the Si, O and C atoms in the silicon oxide thin layer are provided by a ratio of the number of O atoms being 170 to 200 and the number of C atoms being 30 or less with respect to the number of Si atoms of 100 and furthermore, it is more preferable to have the absorption based on the Si—O—Si stretching vibration in a range of 1055 to 1065 $nm^{-1}$ so that the gas barrier property can be improved compared with the conventional thin layer of a silica, an alumina or the like. Moreover, it is preferable to form a thin layer having such an atomic number ratio of Si, O and C so as to have a 1.45 to 1.48 refractive index in terms of improving the gas barrier property.

The Si, O and C atomic number ratio in the silicon oxide thin layer can be provided as mentioned above by adjusting the flow amount ratio of an organic silicon compound gas and an oxygen gas, the amount of the input electric power per unit flow amount of the organic silicon compound, or the like. In particular, it is preferable to control so as to restrain the introduction of the C. Specifically, for example, by adjusting in a range of about 3 to 50 flow rate ratio of the "oxygen gas flow amount/organic silicon compound gas flow amount" so as to form a thin layer similar to an $SiO_2$ and restrain introduction of the C, or by increasing the input electric power per the organic silicon compound unit flow amount so as to facilitate cut off of an Si—C bond and restrain introduction of the C into the thin layer.

As needed, the above-mentioned flow amount ratio may exceed 50.

The atomic number ratio of the Si, O and C in the silicon oxide thin layer can be measured by any apparatus as long as it is an apparatus capable of quantitatively measuring each component of the Si, O and C. For example, an X ray photoelectron spectroscope (ESCA), a Rutherford back scattering analysis spectroscopic apparatus (RBS), or an Auger electron spectroscopic apparatus (AUGER).

When the above-mentioned number of O atoms in the silicon oxide thin layer is less than 170 with respect to the number of Si atoms of 100, which is observed often when the oxygen gas input amount is relatively small or the input electric power per unit flow amount of the organic silicon compound gas is small, consequently the C component ratio is increased so as to have a large amount of the Si—C bonds in the thin layer so that it becomes no longer a thin layer similar to an $SiO_2$ and the oxygen permeation ratio and the water vapor permeation ratio are increased. The number of O atoms in the silicon oxide thin layer can hardly exceed 200 in terms of the stoichiometry.

Moreover, when the above-mentioned number of C atoms in the silicon oxide thin layer is more than 30 with respect to the number of Si atoms of 100, which is observed often in the same case as that having the number of Si atoms is less than 170, since a large amount of the Si—C bonds is provided in the thin layer similarly, and thus it is not preferable neither. The lower limit of the number of C atoms is not particularly limited, but it can be defined to be 10 in the practical thin layer forming process. It is not easy to have the lower limit of the number of C atoms of less than 10 in reality, however, a less than 10 lower limit is preferable in terms of capability of forming a thin layer further closer to the $SiO_2$.

The silicon oxide thin layer as the thin layer 4 preferably has the absorption based on the Si—O—Si stretching vibration in a range of 1,055 to 1,065 $nm^{-1}$ in addition to the above-mentioned ratio of the number of Si, O and C atoms in the thin layer. Such an absorption characteristic can be realized by forming a thin layer similar to the $SiO_2$ in the manner that the flow amount ratio of the "oxygen gas flow amount/organic silicon compound gas flow amount" is adjusted in a range of about 3 to 50, or 50 or more, or preferably in a range of about 3 to 10, or that cut off of the Si—C bond is facilitated by increasing the input electric power per unit flow amount of the organic silicon compound.

A case where no absorption is found in the above-mentioned range is often observed when the flow amount ratio of the "oxygen gas flow amount/organic silicon compound gas flow rate" is small, or the input electric power per unit flow amount of the organic silicon compound is small, and the case consequently causes an increased C component ratio so as to have a large amount of the Si—C bonds in the thin layer, so that the number of the Si—O bonds inherent to a thin layer similar to the $SiO_2$ is relatively made smaller. Thus the oxygen permeation ratio and the water vapor permeation ratio are increased as well.

The above-mentioned absorption can be measured by an infrared spectrophotometer for an IR (near infrared range), preferably with an ATR (multiple reflection) measurement apparatus mounted on the infrared spectrophotometer. It is preferable to use a germanium crystal for a prism and measure with a 45 degree incident angle.

Moreover, it is preferable to form a thin layer having such an atomic number ratio of Si, O and C so as to have a 1.45 to 1.48 refractive index in terms of improvement of the gas barrier property. Such a refractive index range can be realized by having a 3 to 50, or as needed more than that flow amount ratio of the "oxygen gas flow amount/organic silicon compound gas flow amount", or by adjusting the input electric power per unit flow amount of the organic silicon compound.

A case of having a less than 1.45 refractive index is often observed when a silicon oxide thin layer with low density is obtained due to the flow amount ratio of the "oxygen gas flow amount/organic silicon compound gas flow amount" being outside the above-mentioned range, or due to a small input electric power per unit flow amount of the organic silicon compound, and the case makes the oxygen permeation ratio and the water vapor permeation ratio larger, because the thin layer is non-dense. Moreover, a case where the refractive index exceeds 1.48 is often observed when the flow amount ratio of the "oxygen gas flow amount/organic silicon compound gas flow amount" is outside the above-mentioned range, or when impurities such as a C (carbon) introduced, and the case makes the oxygen permeation ratio and the water vapor permeation ratio larger, because the formed silicon oxide thin layer becomes non-dense.

As the organic silicon compound gas for forming the above-mentioned silicon oxide thin layer, a hexamethyl disiloxane, a 1,1,3,3-tetramethyl disiloxane, a tetramethyl silane, a vinyl trimethoxy silane, a vinyl trimethyl silane, a tetramethoxy silane, a methyl trimethoxy silane, a dimethyl dimethoxy silane, a trimethyl methoxy silane, a tetraethoxy silane, a dimethyl diethoxy silane, a methyl dimethoxy silane, a methyl diethoxy silane, a hexamethyl disilazane, or the like can be used.

As the organic silicon compound gas for forming the above-mentioned silicon oxide thin layer, those having little or no Si—C bond in the molecule are more preferable in terms of forming a thin layer similar to the $SiO_2$, and a tetramethoxy silane, a methyl trimethoxy silane, a methyl dimethoxy silane, a tetraethoxy silane, a methyl triethoxy silane, a dimethyl diethoxy silane, a methyl dimethoxy silane, and a methyl diethoxy silane can be presented. In particular, it is preferable to use a tetramethoxy silane or a tetraethoxy silane not having an Si—C bond in the molecule.

Moreover, as the gas explained as the oxygen gas in the above-mentioned description, a gas containing an oxygen atom can be used as well. Specifically, an $N_2O$, a CO or a $CO_2$ can be used.

Thickness of the thin layer 4 in the gas barrier film of the present invention is 5 nm to 1,000 nm, more preferably 300 nm or less. When it is less than the lower limit, an entire surface of the substrate film 2 may not be covered certainly. Moreover, when it is more than the upper limit, cracking can easily be generated. Furthermore the transparency, or the like of the external appearance is lost as well as curling can easily be generated. Furthermore, when it is more than the upper limit, a formation speed of the thin layer 4 is lowered, and thus it is not preferable in terms of the production efficiency.

The thickness of the above-mentioned thin layer 4 may have a more preferable range depending on the application. In the field where the gas barrier film of the present invention is required to have the flexibility such as the packaging field for packaging the food, the medical products or the medical devices, a more preferable thickness of the thin layer 4 is 5 to 30 nm. The gas barrier film having the thin layer 4 with the thickness in this range can hardly generate cracking by folding.

Moreover, in the field where the flexibility is not always required such as the display field using it as the substrate of the display or using it to cover or seal the display, since a higher gas barrier property is needed, a thickness of the thin layer 4 is 50 nm to 1,000 nm in general, more preferably 100 nm to 500 nm.

As special applications for the display, a high gas barrier film used for a film-like liquid crystal display in which a liquid crystal display is made into a film-like form, a high gas barrier film used for a film-like organic EL display in which an organic EL display is made into a film-like form, and furthermore, although it is not for a display, a gas barrier film for a film-like solar battery can be presented.

In the present invention, although the gas barrier layer can comprise only the thin layer 4 alone, it can be made into a composite layer by laminating the overcoat layer 5 on the thin layer 4 to provide a high gas barrier property which have not been obtained in the packaging field. According to the thin layer 4 not accompanying the overcoat layer 5, although there is a slight difference to some extent depending on the forming method, a state with ungrown crystal is generated at the side closer to the surface so as to a portion with a low density tends to be generated between the crystals, and thus the gas barrier property improvement with only the thin layer 4 is limited. Moreover, when a plurality of materials for forming the thin layer 4 are used and a plurality of the thin layers of different materials are laminated, the gas barrier property is improved by thickening of the thickness, but the gas barrier property cannot be improved dramatically. Moreover, particularly in the case of a thin layer comprising an $Al_2O_3$, the layer itself has a disadvantage of easily generating cracking.

When the overcoat layer 5 is laminated on the thin layer 4, since the overcoat layer 5 permeates into a portion with a low density in the thin layer surface so as to compensate the defect portion with the gas barrier property deteriorated, the gas barrier property is presumed to improve. It is preferable that the overcoat layer 5 comprises a resin with a high gas barrier property, however, even if a resin does not always show a high gas barrier property when the gas barrier property is evaluated by forming the overcoat layer 5 alone, it may show a conspicuous improvement of the gas barrier property depending on the combination with the thin layer 4.

Japanese Patent Application Laid Open (JP-A) No. 2001-207130 discloses only that a gas barrier property can be provided by applying a coating layer of a coating material composition comprising at least the above-mentioned silane coupling agent and a cross-linkable compound as raw materials onto a plastic film, and thus there is no disclosure of application on the thin layer 4. Moreover, Japanese Patent Application Laid Open (JP-A) No. 2001-98217 discloses only that a still higher gas barrier property can be provided by forming a gas barrier layer with a co-ring opening condensation product of a silane coupling agent having an amino group and an ethylene imine or the like on a resin, and thereafter forming a metal oxide deposition layer or the like. However, the lamination order is reverse to that of the present invention so that formation of the gas barrier layer on the thin layer for compensating the thin layer defect is not mentioned.

As the resin for forming the overcoat layer 5, a polysiloxane can be used preferably. As the overcoat layer made of a polysiloxane, a coating layer of a coating material composition composed of at least a silane coupling agent having an organic functional group and a hydrolysis group and a cross-linkable compound having an organic functional group reactive with the organic functional group of the silane coupling agent as raw materials can be presented.

As the silane coupling agent having an organic functional group and a hydrolysis group (hereinafter, it may be referred to simply as a silane coupling agent), for example, an amino alkyl dialkoxy silane or an amino alkyl trialkoxy silane represented by the below-mentioned general formula (a) disclosed in Japanese Patent Application Laid Open (JP-A) No. 2001-207130 can be presented;

General Formula (a)

wherein, $A^1$ is an alkylene group, $R^1$ is a hydrogen atom, a lower alkyl group or a following group

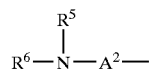

(wherein $A^2$ is a direct bond or an alkylene group, $R^5$, $R^6$ are a hydrogen atom or a lower alkyl group), $R^2$ is a hydrogen atom or a lower alkyl group, $R^3$ is an alkyl group, an aryl group or an unsaturated aliphatic residual group having 1 to 4 carbon atoms respectively. When a plurality of $R^3$ exists in a molecule, they may be same or different with each other. $R^4$ is a hydrogen atom, an alkyl group or an acyl group having 1 to 4 carbon atoms respectively, and it is preferably a hydrogen atom, an alkyl group or an acyl group having 1 to 3 carbon atoms respectively. When a plurality of $R^4$ exists in a molecule, they may be same or different with each other. However, at least one of $R^1$, $R^2$, $R^5$ and $R^6$ is a hydrogen atom. W is either 0, 1 or 2, z is an integer from 1 to 3 and w+z=3).

As the specific examples of an amino alkyl dialkoxy silane or an amino alkyl trialkoxy silane represented by the above-mentioned formula (a), an N-β(amino ethyl) γ-amino propyl trimethoxy silane, an N-β(amino ethyl) γ-amino propyl triethoxy silane, an N-β(amino ethyl) γ-amino propyl triisopropoxy silane, an N-β(amino ethyl) γ-amino propyl tributoxy silane, an N-β(amino ethyl) γ-amino propyl methyl dimethoxy silane, an N-β(amino ethyl) γ-amino propyl methyl diethoxy silane, an N-β(amino ethyl) γ-amino propyl methyl diisopropoxy silane, an N-β(amino ethyl) γ-amino propyl methyl dibutoxy silane, an N-β(amino ethyl) γ-amino propyl ethyl dimethoxy silane, an N-β(amino ethyl) γ-amino propyl ethyl diethoxy silane, an N-β(amino ethyl) γ-amino propyl ethyl diisopropoxy silane, an N-β(amino ethyl) γ-amino propyl ethyl dibutoxy silane, a γ-amino propyl trimethoxy silane, a γ-amino propyl triethoxy silane, a γ-amino propyl triisopropoxy silane, a γ-amino propyl tributoxy silane, a γ-amino propyl methyl dimethoxy silane, a γ-amino propyl methyl diethoxy silane, a γ-amino propyl methyl diisopropoxy silane, a γ-amino propyl methyl dibutoxy silane, a γ-amino propyl ethyl dimethoxy silane, a γ-amino propyl ethyl diethoxy silane, a γ-amino propyl ethyl diisopropoxy silane, a γ-amino propyl ethyl dibutoxy silane, a γ-amino propyl triacetoxy silane, or the like can be presented, and one kind or two or more kinds thereof can be used.

The cross-linkable compound having an organic functional group reactive with the organic functional group of the above-mentioned silane coupling agent (hereinafter it may be referred to simply as a cross-linkable compound) is one having a functional group reactive with an amino group, such as a glycidyl group, a carboxyl group, an isocyanate group, and an oxazoline group. As the specific examples thereof, diglycidyl ethers such as an ethylene glycol diglycidyl ether, diethylene glycol diglycidyl ether, a triethylene glycol diglycidyl ether, a tetraethylene glycol diglycidyl ether, a nonaethylene glycol diglycidyl ether, a propylene glycol diglycidyl ether, a dipropylene glycol diglycidyl ether, a tripropylene glycol diglycidyl ether, a 1,6-hexane diol diglycidyl ether, a neopentyl glycol diglycidyl ether, a diglycidyl ether adipate, an o-diglycidyl ether phthalate, and a glycerol diglycidyl ether; triglycidyl ethers such as a glycerol triglycidyl ether, a diglycerol triglycidyl ether, a triglycidyl tris(2-hydroxy ethyl)isocyanurate, and a trimethylol propane triglycidyl ether; tetraglycidyl ethers such as a pentaerythritol tetraglycidyl ether; polyglycidyl ethers or polymers having a glycidyl group as a functional group; dicarboxylic acids such as a tartaric acid and an adipic acid; a carboxyl group containing polymer such as a polyacrylic acid; isocyanates such as a hexamethylene diisocyanate, a xylylene diisocyanate; an oxazoline containing polymer, an alicyclic epoxy compound, or the like can be presented, and one kind or two or more kinds thereof can be used. In terms of the reactivity, a compound having two or more glycidyl groups can be used preferably.

The use amount of the above-mentioned cross-linkable compound is preferably 0.1 to 30% (by mass, the same is applied hereafter) with respect to the silane coupling agent, and more preferably it is 1 to 200%. When the cross-linkable compound is less than 0.1%, the flexibility of the coating layer may be insufficient, and in the case it is used with more than 300%, there is risk of the gas barrier property deterioration. The silane coupling agent and the cross-linkable compound are agitated while as needed being heated so as to provide a coating material composition.

By coating and drying the coating material composition prepared with the silane coupling agent and the cross-linkable compound as the materials on the thin layer 4, hydrolysis and condensation of the silane coupling agent and cross-linking by the cross-linkable compound proceed so as to obtain a polysiloxane coating layer having a cross-linking structure.

The above-mentioned composition may further contain a silane compound having a hydrolysis group and not having an organic functional group such as an amino group. As the specific examples thereof, a tetramethoxy silane, a tetraethoxy silane, a tetraisopropoxy silane, a tetrabutoxy silane, a methyl trimethoxy silane, a methyl triethoxy silane, a methyl triisopropoxy silane, a methyl tributoxy silane, an ethyl trimethoxy silane, an ethyl triethoxy silane, an ethyl triisopropoxy silane, an ethyl tributoxy silane, a dimethyl dimethoxy silane, a dimethyl diethoxy silane, a dimethyl diisopropoxy silane, a dimethyl dibutoxy silane, a diethyl dimethoxy silane, a diethyl diethoxy silane, a diethyl diisopropoxy silane, a diethyl dibutoxy silane, a vinyl trimethoxy silane, a vinyl triethoxy silane, a γ-glycide propyl trimethoxy silane, a γ-glycide propyl triethoxy silane, a γ-methacryloxy propyl trimethoxy silane, a γ-chloropropyl trimethoxy silane, a γ-mercapto propyl trimethoxy silane, or the like can be presented, and one kind or two kinds thereof can be used.

When containing the above-mentioned silane compound having the hydrolysis group and not having an organic functional group such as an amino group or the like and a hydrolysis group, co-hydrolysis and condensation of the silane coupling agent having an organic functional group such as an amino group and a hydrolysis group and cross-linking by the cross-linkable compound proceed so as to obtain a polysiloxane coating layer having a cross-linking structure.

The coating material composition may further contain a (co) hydrolysis condensation product of a silane coupling agent not having an organic functional group such as an amino group and a hydrolysis group and/or a silane compound having a hydrolysis group and not having an organic functional group such as an amino group. In addition thereto, to the coating material composition, various kinds of inorganic or organic additives such as a silane compound, a solvent, a hardening catalysis, a wettability improving agent, a plasticizing agent, an antifoaming agent and a thickening agent other than the above-mentioned can be added as needed.

The coating application of the above-mentioned coating material composition can be carried out by a known coating means, such as bar coating, spin coating, dip coating, gravure coating, roll coating, die coating, comma coating or the like, and coating thickness is about 0.1 to 10 μm in a dried state. Preferably by heating and drying with an about 30° C. to 60° C. temperature condition after the application, the overcoat layer 5 comprising a polysiloxane can be obtained. As another resin forming the overcoat layer 5, an epoxy/silicate (such as one represented by the below-mentioned chemical formula) can be used so that the excellent bonding property with respect to the thin layer 4 made of a metal oxide can be provided. The epoxy/silicate can be cross-linked by a diamine based cross-linking agent utilizing the epoxy part.

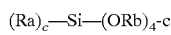

Wherein Ra, Rb are as mentioned below. C is an integer from 1 to 4.

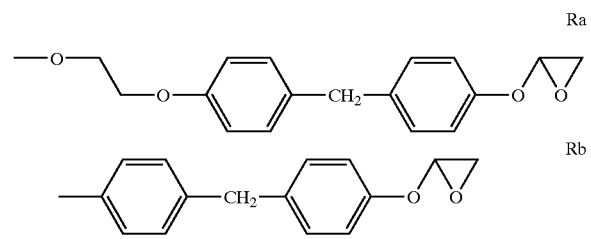

As a resin forming the overcoat layer 5, a polyvinyl alcohol (PVA) and an ethylene-vinyl alcohol copolymer (EVOH) can be used alone or as a mixture. For example, the water vapor permeation ratio of the PVA alone is about 0.5 g/m²·day·atm or less than that. Or the overcoat layer 5 can be formed from this sole or mixture material provided with a cross-linking structure by adding a cross-linking agent such as an aromatic acid ester, an aromatic polyamide and a metal salt, or by adding an inorganic filler thereto. Specifically, as the resin forming the overcoat layer 5, one prepared by dispersing a layer-like silicate (clay ore such as a montmorillonite) as super fine particles of about 1 to 100 nm in a nylon, a PVA, or an EVOH can be used as well.

In addition to the above-mentioned, as the resin forming the overcoat layer 5, resins having a high bonding property with respect to an inorganic substance such as a metal, such as an epoxy-, an urethane-, a polyamide-, a polyimide-, a polyester-, an acrylic- and a vinyl chloride-resins can be used. Furthermore, an ultraviolet ray hardening type or electron beam hardening type resin composition such as an acrylate based one, in particular, one having a functional group such as an epoxy group, an amino group and an OH group can be used as well.

When the above-mentioned resins are used, the overcoat layer 5 can be formed by as needed dissolving the resin in a solvent or dispersing the same by a dispersing agent so as to prepare a coating solution, coating the same by a known method, drying and as needed by heating so as to be solidified.

In addition to the use of the above-mentioned resins or the combination use of a layer-like silicate and a resin, the overcoat layer 5 can be formed by using a polysilazane (the below-mentioned chemical formula) as an inorganic polymer.

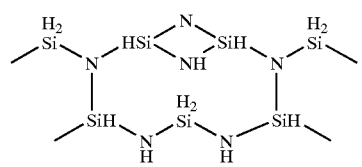

For providing the overcoat layer 5 using a polysilazane, a solution of a polysilazane, such as a xylene solution is coated and thereafter dried the same for eliminating the dispersion medium so that an overcoat layer extremely close to a quartz can be formed.

Figure 2:
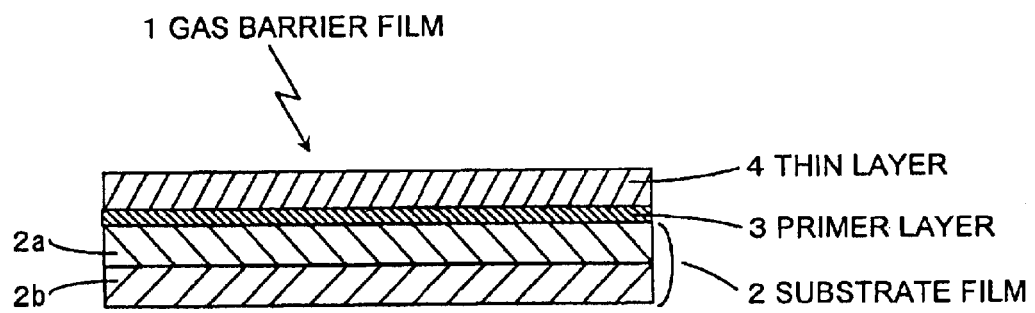
FIG. 2 is a schematic cross-sectional view showing another embodiment of the lamination structure of a gas barrier film of the present invention.

Although the gas barrier film 1 of the present invention can provide the gas barrier property with one sheet having the lamination structure explained with reference to FIGS. 1, 2 and 3, the gas barrier property can further be improved by laminating two or more sheets of the composite films having the lamination structure. For the lamination, an adhesive can be used preferably. At the time of laminating the two or more sheets of the gas barrier films 1, there are the case of laminating with the same front and back sides superimposed and the case of laminating with the opposite sides superimposed. In the case of the gas barrier film 1 with the lamination structure explained with reference to FIG. 1, the former case is for example a lamination structure of a substrate film/a primer layer/a thin layer/an adhesive layer/a substrate film/a primer layer/a thin layer, and the latter case is for example a lamination structure of a substrate film/a primer layer/a thin layer/an adhesive layer/a thin layer/a primer layer/a substrate film. The mark "/" denotes that the before and after layers are laminated.

In the case of the gas barrier film 1 with the lamination structure explained with reference to FIG. 3, the former case is for example a lamination structure of a substrate film/a primer layer/a thin layer/an overcoat layer/an adhesive layer/a substrate film/a primer layer/a thin layer/an overcoat layer, and the latter case is for example a lamination structure of a substrate film/a primer layer/a thin layer/an overcoat layer/an adhesive layer/an overcoat layer/a thin layer/a primer layer/a substrate film. In the former case, the overcoat layer in contact with the adhesive layer can be omitted. In the latter case, either or both of the two overcoat layers can be omitted.

According to the gas barrier film 1 of the present invention explained with reference to FIG. 3, the thin layer 4 and the overcoat layer 5 constitute the gas barrier layer. The gas barrier layer can be laminated by two sets or more sets. For example, when it is laminated by two sets, a lamination structure of a substrate film/a primer layer/a thin layer/an overcoat layer/a thin layer/an overcoat layer can be provided.

When the gas barrier film is laminated by two or more sheets, and the gas barrier layer is laminated by two or more sets, the product consequently obtained by the lamination can have two or more layers of the thin layer and two or more layers of the overcoat layer. In this case, it can be the thin layer of two or more layers of different materials, or it can be two or more overcoat layers of different materials.

For the lamination of the gas barrier films with each other, lamination can be executed by thermal fusion utilizing the materials of the surfaces to be bonded, or the material of one of them, but it can be carried out more certainly by the lamination via an adhesive layer as mentioned above. The adhesive layer can be provided using a known material. Specifically, it can be formed using a polyurethane based adhesive. More preferably, one having a functional group such as an epoxy group, an amino group and an OH group can be used. As mentioned above, when one of the gas barrier films lacks the overcoat layer and the adhesive layer provides the function of the overcoat layer instead, it is preferable to first form the adhesive layer directly on the thin layer of the gas barrier film not having the overcoat layer, and then making the same adhere to the other gas barrier film in terms of the overcoat layer permeation to the part with a low density of the surface of the thin layer.

Since the gas barrier film 1 of the present invention has the above-mentioned lamination structure, or can be obtained by the above-mentioned production method, a high gas barrier property can be provided so that it can be applied to various kinds of displays or display elements.

Figure 4:
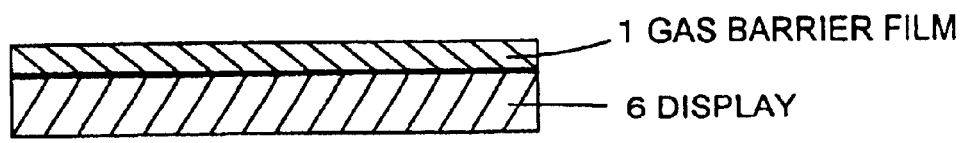
FIG. 4 is a cross-sectional view showing an application embodiment of a gas barrier film of the present invention.
Figure 5:
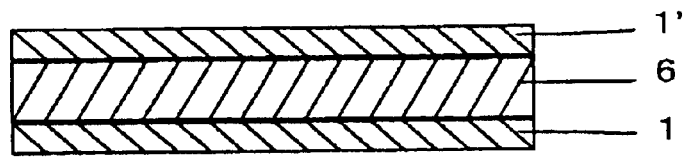
FIG. 5 is a cross-sectional view showing another application embodiment of a gas barrier film of the present invention.
Figure 6:
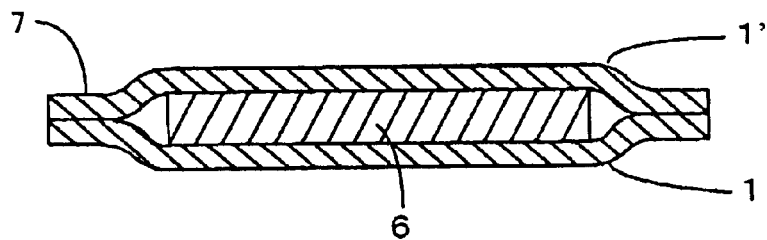
FIG. 6 is a cross-sectional view showing still another application embodiment of a gas barrier film of the present invention; and, FIGS. 7A, 7B and 7C are diagrams for explaining the method for measuring the rigidity of a substrate film.

FIGS. 4 to 6 are cross-sectional views showing the cross-sectional structures using the gas barrier film 1 for a display 6. As shown in FIG. 4, the gas barrier film 1 may be laminated on one side of the display 6. As shown in FIG. 5, the gas barrier films 1 and 1' may be laminated on the each side of the display 6, or as shown in FIG. 6, the display 6 can be disposed between two sheets of the gas barrier films 1 and 1' such that the two gas barrier films 1 and 1' have a sealing part 7 in the circumference, preferably in the entire circumference so as to be sealed. In the structure as shown in FIG. 2C, the gas barrier film 1 and/or 1' and the display 6 may be bonded or may not be bonded.

As shown in FIGS. 4 to 6, when the gas barrier film is applied to the display 6, either the substrate film 2 side or the side having the thin layer 4 (it may be the case of the overcoat layer 5 or the case of the thin layer 4 for lacking the overcoat layer) of the gas barrier film may be disposed on the display 6 side. As shown in FIGS. 5 and 6, in the case of using the two gas barrier films, the substrate film side of one of the gas barrier films may be disposed on the display 6 side, and the side having the thin layer of the other gas barrier film may be disposed on the display 6 side.

The gas barrier film is applied to the display 6 as shown in FIGS. 4 to 6 by using an adhesive, preferably a pressure sensitive adhesive. In the case of accompanying sealing as shown in FIG. 6, it is possible to laminate a thermally fusible type adhesive layer on the inner sides of the sealing parts 7 to be sealed so as to be sealed only by the thermal fusion of the thermally fusible adhesive layers with each other. Of course, at the part to be contacted with the display 6, the display 6 and the gas barrier film may be laminated via an adhesive, preferably via a pressure sensitive adhesive.

Although the gas barrier film is provided on one side or the both sides of the display 6 in the embodiments shown in FIGS. 4 to 6, the gas barrier film 1 of the present invention can be used also as a substrate constituting the display itself. When the display comprises two substrates, one or both of the substrates can be substituted by the gas barrier film of the present invention.

When the gas barrier film of the present invention is used as a display substrate, a layer necessary in each display system can be laminated on either the front side or the rear side of the gas barrier film. In some cases, since the additional layer may be laminated between the substrate film and the gas barrier layer, the gas barrier films of the present invention include those having a layer for providing the function of a display between the substrate film and the thin layer.

As the displays using the gas barrier film 1 of the present invention, there are those of various kinds. As a representative example, a liquid crystal display and an organic EL element can be presented.

A liquid crystal display is provided by disposing two glass substrates facing with each other with a predetermined interval provided therebetween, disposing a transparent electrode on an each inner surface, accompanying with an orientation layer or the like, providing a liquid crystal in the gap between the pair of the glass substrates, and sealing the circumference. In general, a color filter is provided thereto in order to make a color video image. The gas barrier film of the present invention can be applied to the outside of such a glass substrates of the liquid crystal display, or the gas barrier film 1 of the present invention can be used instead of the glass substrates. In particular, by substituting both of the two glass substrates by the gas barrier film of the present invention, an entirely flexible display can be provided.

An organic EL display is provided by disposing two glass substrates facing with each other, disposing a transparent electrode on an each inner surface, providing an organic EL element layer formed by, for example, a composite layer or the like in which layers having each function of (a) an injection function, (b) a transportation function and (c) a light emitting function are laminated in the gap between the pair of the glass substrates, and sealing the circumference. A color filter for making a color video image or another means may be accompanied. As in the case of the liquid crystal display, the gas barrier film of the present invention can be applied to the outside of the glass substrates, or the gas barrier film 1 of the present invention can be used instead of the glass substrates. By substituting both of the two glass substrates by the gas barrier film of the present invention, an entirely flexible display can be provided. In particular, since the organic EL element is chemically unstable and extremely weak to the humidity for the use of a fluorescent substance, a high water vapor property as the product is required so that one having a small coefficient of humidity expansion and/or a small coefficient of thermal expansion is desired as the substrate film of the gas barrier film in order to ensure the water vapor barrier property of the gas barrier film lamination structure.

EXAMPLE A SERIES

Example A-1

A polycarbonate having a 220° C. glass transition temperature, a 75 ppm/° C. coefficient of thermal expansion and a 0.23 ppm/% RH coefficient of humidity expansion (produced by Bayer Co., Ltd., product name: "BAYHOL LP202", thickness: 200 $\mu$m) was used as the substrate film. A siloxane based UV hardening type polymer solution (3% isopropyl alcohol solution of "X-12-2400" produced by Shin-Etsu Chemical Co., Ltd.) was coated on one side thereof by a gravure printing method. After hot air drying at the 120° C. temperature, ultraviolet ray hardening was executed so as to form a primer layer having a 0.1 $\mu$m thickness.

Then, after exhausting the chamber using a winding up type vacuum deposition apparatus until the attained vacuum degree became $3.0 \times 10^{-5}$ torr ($4.0 \times 10^{-3}$ Pa), an oxygen gas was introduced to the vicinity of a coating drum while maintaining the pressure in the chamber at $3.0 \times 10^{-4}$ torr ($4.0 \times 10^{-2}$ Pa). A silicon monoxide as the evaporation source was heated by about 10 kW electric power by means of a pierce type electron gun to carry out the vapor deposition on a primer layer of a polycarbonate film running at a 120 m/min rate on the coating drum, thus forming a silicon oxide thin layer with 500 Å thickness.

Furthermore, by coating a polysilazane dispersion liquid (10% solution of "NL-110" produced by Clariant Japan Corp.) on the silicon oxide thin layer by a gravure printing method, executing hot air drying at a 120° C. temperature, and aging for 3 days at a 80° C. temperature to form an overcoat layer with 1 μm thickness, a gas barrier film of the present invention was obtained.

Evaluation results of the characteristics of the obtained gas barrier film are as follows.

| | |
|---|---|
| Total light beam transmission ratio: | 91% |
| Oxygen permeation ratio: | 0.09 cc/m² · day |
| Water vapor permeation ratio: | 0.05 g/m² · day |
| Surface smoothness: | 2.5 nm |

The oxygen permeation ratio was measured by an oxygen gas permeation ratio measuring apparatus (produced by Modern Control Corp., OXTRAN 2/20). The water vapor permeation ratio was measured by a water vapor gas permeation ratio measuring apparatus (produced by Modern Control Corp., PERMATRAN-W3/31). Moreover, evaluation results of the characteristics of a gas barrier film obtained by coating an organic EL element on the obtained gas barrier film and drying at 180° C. for 6 hours are as follows.

| | |
|---|---|
| Total light beam transmission ratio: | 90% |
| Oxygen permeation ratio: | 0.1 cc/m² · day |
| Water vapor permeation ratio: | 0.07 g/m² · day |
| Surface smoothness: | 2.7 nm |

Example A-2

A gas barrier film was produced in the same manner as in the example A-1 except that a polyether sulfone (PES) resin film having a 230° C. glass transition temperature, a 45 ppm/° C. coefficient of thermal expansion, a 4.5 ppm/% RH coefficient of humidity expansion and a 200 μm thickness (produced by Sumitomo Bakelite Co., Ltd.) was used as the film substrate.

Evaluation results of the characteristics of the obtained gas barrier film are as follows.

| | |
|---|---|
| Total light beam transmission ratio: | 90% |
| Oxygen permeation ratio: | 0.1 cc/m² · day |
| Water vapor permeation ratio: | 0.06 g/m² · day |
| Surface smoothness: | 2.8 nm |

The gas barrier property was similar to that of the example A-1. Moreover, evaluation results of the characteristics of a gas barrier film obtained by coating an organic EL element on the obtained gas barrier film and drying at 180° C. for 6 hours are as follows.

| | |
|---|---|
| Total light beam transmission: | 89% |
| Oxygen permeation ratio: | 0.2 cc/m² · day |
| Water vapor permeation ratio: | 0.08 g/m² · day |
| Surface smoothness: | 3 nm |

Example A-3

A gas barrier film was produced in the same manner as in the example A-1 except that a film of a norbornene based resin having a 183° C. glass transition temperature, a 70 ppm/° C. coefficient of thermal expansion, a 0.67 ppm/% RH coefficient of humidity expansion and a 200 μm thickness (produced by JSR Corporation, product name: "ARTON") was used as the film substrate.

Evaluation results of the characteristics of the obtained gas barrier film are as follows.

| | |
|---|---|
| Total light beam transmission ratio: | 90% |
| Oxygen permeation ratio: | 0.2 cc/m² · day |
| Water vapor permeation ratio: | 0.08 g/m² · day |
| Surface smoothness: | 4.8 nm |

The gas barrier property was similar to that of the example A-1. Moreover, evaluation results of the characteristics of a gas barrier film obtained by coating an organic EL element on the obtained gas barrier film and drying at 180° C. for 6 hours are as follows.

| | |
|---|---|
| Total light beam transmission ratio: | 89% |
| Oxygen permeation ratio: | 0.2 cc/m² · day |
| Water vapor permeation ratio: | 0.05 g/m² · day |
| Surface smoothness: | 5 nm |

Example A-4

A gas barrier film was produced in the same manner as in the example A-1 except that a film of a cycloolefin polymer having a 176° C. glass transition temperature, a 78 ppm/° C. coefficient of thermal expansion, a 0.35 ppm/% RH coefficient of humidity expansion and a 200 μm thickness (produced by ZEON CORPORATION, product name: "ZEONOA") was used as the film substrate.

Evaluation results of the characteristics of the obtained gas barrier film are as follows.

| | |
|---|---|
| Total light beam transmission ratio: | 92% |
| Oxygen permeation ratio: | 0.13 cc/m² · day |
| Water vapor permeation ratio: | 0.04 g/m² · day |
| Surface smoothness: | 3 nm |

The gas barrier property was similar to that of the example A-1. Moreover, evaluation results of the characteristics of a gas barrier film obtained by coating an organic EL element on the obtained super gas barrier film and drying at 180° C. for 6 hours are as follows.

| | |
|---|---|
| Total light beam transmission ratio: | 89% |
| Oxygen permeation ratio: | 0.2 cc/m² · day |
| Water vapor permeation ratio: | 0.08 g/m² · day |
| Surface smoothness: | 3.2 nm |

Example A-5

A gas barrier film was produced in the same manner as in the example A-1 except that a polyethylene naphthalate resin film having a 155° C. glass transition temperature, a 8 ppm/° C. coefficient of thermal expansion, a 0.5 ppm/% RH coefficient of humidity expansion and a 200 μm thickness (produced by Teijin Dupont Co., Ltd., product name: "K1030") was used as the film substrate.

Evaluation results of the characteristics of the obtained gas barrier film are as follows.

| | |
|---|---|
| Total light beam transmission ratio: | 90% |
| Oxygen permeation ratio: | 0.07 cc/m² · day |
| Water vapor permeation ratio: | 0.03 g/m² · day |
| Surface smoothness: | 3.5 nm |

The gas barrier property was similar to that of the example A-1. Moreover, evaluation results of the characteristics of a gas barrier film obtained by coating an organic EL element on the obtained super gas barrier film and drying at 180° C. for 6 hours are as follows.

| | |
|---|---|
| Total light beam transmission ratio: | 89% |
| Oxygen permeation ratio: | 0.09 cc/m² · day |
| Water vapor permeation ratio: | 0.05 g/m² · day |
| Surface smoothness: | 3.5 nm |

Comparative Example a-1

A gas barrier film was produced in the same manner as in the example A-1 except that a polyethylene terephthalate (PET) resin film having a 120° C. glass transition temperature, a 5 ppm/° C. coefficient of thermal expansion, a 0.5 ppm/% RH coefficient of humidity expansion and a 200 μm thickness (produced by Toyobo Co., Ltd.) was used as the film substrate.

Evaluation results of the characteristics of the obtained gas barrier film are as follows.

| | |
|---|---|
| Total light beam transmission ratio: | 91% |
| Oxygen permeation ratio: | 0.09 cc/m² · day |
| Water vapor permeation ratio: | 0.03 g/m² · day |
| Surface smoothness: | 3.5 nm |

The gas barrier property was similar to that of the example A-1. Moreover, evaluation results of the characteristics of a gas barrier film obtained by coating an organic EL element on the obtained gas barrier film and drying at 180° C. for 6 hours are as follows.

| | |
|---|---|
| Total light beam transmission ratio: | 89% |
| Oxygen permeation ratio: | 5.0 cc/m² · day |
| Water vapor permeation ratio: | 3.5 g/m² · day |
| Surface smoothness: | 5 nm |

EXAMPLE B SERIES

Example B-1

A polycarbonate film (produced by Bayer Co., Ltd., product name; "BAYHOL LP202", glass transition temperature: 210° C., coefficient of thermal expansion: 75 ppm/° C., coefficient of humidity expansion: 0.5 ppm/% RH, thickness: 200 μm) was used as the substrate film. A polysilazane dispersion liquid (3% solution of "NL-110" produced by Clariant Japan Co., Ltd.) was coated on one side thereof by a gravure printing method. Hot air drying at the 120° C. temperature was executed to form a primer layer with 0.1 μm thickness. Then, after exhausting the chamber using a winding up type vacuum deposition apparatus until the attained vacuum degree became $3.0 \times 10^{-5}$ torr ($4.0 \times 10^{-3}$ Pa), an oxygen gas was introduced to the vicinity of a coating drum while maintaining the pressure in the chamber at $3.0 \times 10^{-4}$ torr ($4.0 \times 10^{-2}$ Pa). A silicon monoxide as the evaporation source was heated by about 10 kW electric power by means of a pierce type electron gun to carry out the vapor deposition on a primer layer of a polycarbonate film running at a 120 m/min rate on the coating drum, thus forming a silicon oxide thin layer with 500 Å thickness.

By bar coating a reaction liquid obtained by heating and agitating a γ-amino propyl trimethoxy silane, a resorcinol diglycidyl ether and a tetramethoxy silane (mass ratio 5:1:4) onto the above-mentioned silicon oxide thin layer to form an overcoat layer with 2 μm thickness after drying, a gas barrier film of the present invention was obtained.

Evaluation results of the characteristics of the obtained gas barrier film are as follows.

| | |
|---|---|
| Total light beam transmission ratio: | 91% |
| Oxygen permeation ratio: | 0.1 cc/m² · day |
| Water vapor permeation ratio: | 0.05 g/m² · day |
| Surface smoothness: | 3 nm |

The oxygen permeation ratio was measured by an oxygen gas permeation ratio measuring apparatus (produced by Modern Control Co., Ltd., OXTRAN 2/20. The water vapor permeation ratio was measured by a water vapor gas permeation ratio measuring apparatus (produced by Modern Control Co., Ltd., PERMATRAN-W3/31).

Example B-2

The experiment was carried out by using a polyether sulfone (PES) resin film having a 230° C. glass transition temperature, a 60 ppm/° C. coefficient of thermal expansion, a 2.0 ppm/% RH coefficient of humidity expansion and a 200 μm thickness (produced by Sumitomo Bakelite Co., Ltd.) as the substrate film. Moreover, the thin layer formation of a silicon oxide was executed using a plasma CVD apparatus. After exhausting the chamber until the attained vacuum degree became $3.0 \times 10^{-5}$ torr ($4.0 \times 10^{-3}$ Pa), a high frequency was applied. By introducing three kinds of gases of a tetramethoxy silane, an oxygen and a helium by a 1:1:3 flow amount and maintaining the pressure in the film formation chamber at 0.25 torr, a thin layer of a silicon oxide with a 500 Å thickness was formed. In the same manner as in the example B-1 except for formation of the silicon oxide thin layer, a gas barrier film was produced.

Evaluation results of the characteristics of the obtained gas barrier film are as follows.

| | |
|---|---|
| Total light beam transmission ratio: | 90% |
| Oxygen permeation ratio: | 0.1 cc/m$^2$ · day |
| Water vapor permeation ratio: | 0.08 g/m$^2$ · day |
| Surface smoothness: | 3 nm |

EXAMPLE C SERIES

Example C-1

One obtained by laminating a biaxial orientation PEN film (produced by Teijin Dupont Films Co., Ltd., thickness: 100 μm, width: 710 nm) and a biaxial orientation PET film (produced by Toyobo Co., Ltd., thickness; 100 μm, width: 710 mm) by a dry laminate method was used as the substrate film (glass transition temperature: 155° C., coefficient of thermal expansion: 8 ppm/° C., coefficient of humidity expansion: 0.5 ppm/% RH). As the adhesive for the dry lamination, a two liquid hardening type polyester urethane based adhesive (produced by Takeda Chemical Industries, Ltd., TAKERAc A-515/TAKENATE A-3) was used with a 4.1 g/m$^2$ (dried state) coating amount by gravure roll coating. The thin layer was formed in the same manner as in the example B-1 to obtain a transparent gas barrier film. The thickness of the silicon oxide thin layer was 100 nm.

Evaluation results of the characteristics of the obtained gas barrier film are as follows.

| | |
|---|---|
| Total light beam transmission ratio: | 90% |
| Oxygen permeation ratio: | 0.07 cc/m$^2$ · day |
| Water vapor permeation ratio: | 0.03 g/m$^2$ · day |
| Surface smoothness: | 3.5 nm |

Example C-2

A transparent gas barrier film was obtained in the same manner as in the example C-1 except that one obtained by laminating two pieces of biaxial orientation PEN film (both produced by Teijin Dupont Films Co., Lid., with the same thickness and width of thickness: 100 μm, width: 710 nm) with each other was used as the substrate film (glass transition temperature: 155° C., coefficient of thermal expansion: 5 ppm/° C., coefficient of humidity expansion: 0.8 ppm/% RH).

EVALUATION

The water vapor permeation ratio and the oxygen permeation ratio of each transparent gas barrier film produced in the above-mentioned example C-1 and C-2, and furthermore, the measurement result of the tension strength of the substrate used in the each example are shown in the Table 1. In the Table 1, the water vapor permeation ratio was measured by a water vapor gas permeation ratio measuring apparatus (produced by Modern Control Co., Ltd., PERMATRAN-W3/31) in a condition of 37.8° C. measurement temperature and 100% RH humidity. Moreover, the oxygen permeation ratio was measured by an oxygen gas permeation ratio measuring apparatus (produced by Modern Control Co., Ltd., OXTRAN 2/20) in a condition of 23° C. measurement temperature and 90% RH humidity.

The rigidity was measured by cutting out a piece of strip specimen with a 25 mm width and a 12 cm length from the transparent gas barrier film obtained in each example, forming a loop by a 10 cm part excluding 1 cm of the both ends, and measuring the repulsion force at the time of pressing the loop by a 20 mm pressing distance and a 200 mm/min pressing speed by means of an universal tester (produced by Orientech Co., Ltd., product number: "RTC-1310A"). A larger measurement value represents a larger rigidity.

TABLE 1

| Substrate | Water vapor permeation ratio (g/m$^2$ · /day) | Oxygen permeation ratio (cc/m$^2$/day) | Rigidity (N) |
|---|---|---|---|
| Example C-1 | 0.1 | 0.2 | 6.7 |
| Example C-2 | 0.1 | 0.2 | 9.0 |

As it is apparent from the above-mentioned Table 1, the gas barrier films of the examples C-1 and C-2 have the excellent water vapor barrier property and oxygen barrier property.

What is claimed is:

1. A gas barrier film comprising a composite film provided with a gas barrier layer on a substrate film, wherein the substrate film has a (1) 80 ppm/° C. or less coefficient of thermal expansion at 50° C. to 150° C. and/or a 10 ppm/% RH or less coefficient of humidity expansion at 25° C., and a (2) 150° C. or more glass transition temperature, and the gas barrier layer has a laminated structure including at least a metal oxide thin layer and an overcoat layer made of a gas barrier property resin for filling the minute pores of the thin layer, the thin layer and the overcoat layer being laminated in this order from the substrate film side.

2. A gas barrier film according to claim 1, wherein the thin layer is formed by a physical or chemical vapor phase method selected from the group consisting of a vapor deposition method, a sputtering method, an ion plating method and a plasma chemical vapor phase epitaxy method, or a liquid phase deposition method selected from the group consisting of a plating and a sol-gel method.

3. A gas baffler film according to claim 1, wherein the overcoat layer is made of a polysiloxane.

4. A gas barrier film according to claim 3, wherein the overcoat layer made of a polysiloxane is a coating layer of a coating material composition composed of at least a silane coupling agent having an organic functional group and a hydrolysis group, and a cross-linkable compound having an organic functional group reactive with the organic functional group of the silane coupling agent as raw materials.

5. A gas barrier film according to claim 1, wherein the rigidity of the substrate film is in a range of 0.5 N to 15 N.

6. A gas barrier film according to claim 1, wherein two or more gas barrier layers are laminated on the substrate film.

7. A gas barrier film according to claim 1, wherein two or more composite films are laminated in the gas barrier film.

8. A display with both surfaces of a display element covered with a gas barrier film, wherein the gas barrier film comprises a composite film provided with a gas barrier layer having a laminated structure including at least a metal oxide thin layer on a substrate film having a (1) 80 ppm/° C. or less coefficient of thermal expansion at 50° C. to 150° C. and/or a 10 ppm/% RH or less coefficient of humidity expansion at 25° C., and a (2) 150° C. or more glass transition temperature.

9. A display according to claim 8, wherein the display element is sealed by the gas barrier film.

10. A display according to claim 8, wherein the gas barrier film forms a substrate at least on the observer side of the display element.

11. A display according to claim 8, wherein the rigidity of the substrate film is in a range of 0.5 N to 15 N.

* * * * *